United States Patent
Clevenger et al.

(10) Patent No.: US 8,665,575 B2
(45) Date of Patent: Mar. 4, 2014

(54) SOLAR MODULE WITH OVERHEAT PROTECTION

(75) Inventors: Lawrence A. Clevenger, LaGrangeville, NY (US); Harold J. Hovel, Katorah, NY (US); Rainer Krause, Kostheim (DE); Zhengwen Li, Danbury, CT (US); Kevin S. Petrarca, Newburgh, NY (US); Gerd Pfeiffer, Poughquaz, NY (US); Kevin Prettyman, Poughkeepsie, NY (US); Carl J. Radens, LaGrangeville, NY (US); Brian C. Sapp, Gainsville, FL (US)

(73) Assignee: International Business Machines Corporation, Armonk, NY (US)

(*) Notice: Subject to any disclaimer, the term of this patent is extended or adjusted under 35 U.S.C. 154(b) by 106 days.

(21) Appl. No.: 13/166,842

(22) Filed: Jun. 23, 2011

(65) Prior Publication Data

US 2011/0317324 A1 Dec. 29, 2011

(51) Int. Cl.
*H02H 5/04* (2006.01)
(52) U.S. Cl.
USPC ........................................ 361/103

(58) Field of Classification Search
USPC .................... 361/103, 104; 136/244
See application file for complete search history.

(56) References Cited

U.S. PATENT DOCUMENTS

| | | | |
|---|---|---|---|
| 6,020,555 | A | 2/2000 | Garboushian et al. |
| 6,307,144 | B1 | 10/2001 | Mimura et al. |
| 2008/0198523 | A1 | 8/2008 | Schmidt et al. |
| 2009/0014056 | A1 | 1/2009 | Hockaday |
| 2009/0183760 | A1 | 7/2009 | Meyer |
| 2011/0240100 | A1* | 10/2011 | Lu et al. ............... 136/251 |

FOREIGN PATENT DOCUMENTS

JP 01177832 7/1989

* cited by examiner

*Primary Examiner* — Dharti Patel
(74) *Attorney, Agent, or Firm* — Michael J. Lestrange

(57) ABSTRACT

A photovoltaic module (10) with a plurality of solar cells (20) interconnected in serial and/or parallel arrangement within the module (10) is equipped with an overheat protection system (30) for suppressing damages of the photovoltaic module (10) due to defects of the solar cells (20). The overheat protection system (30) comprises a heat sensor (32) which is thermally coupled to a solar cell (20). The heat sensor (32) is physically integrated into an electrical switch (34, 36, 38) which is electrically connected to said solar cell (20).

12 Claims, 3 Drawing Sheets

SOLAR MODULE WITH OVERHEAT PROTECTION

FIELD OF THE INVENTION

The invention relates generally to photovoltaic modules comprising a plurality of solar cells, and specifically to a system for protecting photovoltaic modules from damage due to overheating of solar cells within the module.

BACKGROUND OF THE INVENTION

Photovoltaic modules for converting solar energy to electrical energy generally are made up of a set of solar cells which are mounted on a common base and are electrically interconnected. Frequently, a plurality of these photovoltaic modules are connected to obtain a desired electrical output, i.e. a specific voltage and a specific current.

Photovoltaic modules are susceptible to failure and loss of conversion efficiency during operation due to degradation and/or short circuit damage of individual solar cells within the modules. As the current carrying capacity of a particular solar cell decreases, the output from other solar cells connected in series with this cell reverse biases the damaged cell. The voltage across the damaged cell increases in a reverse polarity until the full output voltage of all other solar cells connected in serial arrangement with the damaged cell is impressed on the damaged cell. This causes the damaged cell to break down at a relatively high reverse breakdown voltage. The damaged cell then dissipates a large amount of power, leading to a considerable amount of heat to be generated in this specific solar cell. This May cause major problems and may even lead to the photovoltaic module catching fire.

This problem is generally resolved by bridging the serial arrangement of solar cells with a diode in such a way that the diode's cathode is connected to the positive terminal of the serial string of solar cells and the diode's anode is connected to the negative terminal of the serial string. If one of the solar cells is defective, the diode provides a low impedance bypass of the serial string of solar cells. As a consequence, the power being dissipated in the damaged cell is limited to, at most, the power generated by the undamaged cells in the serial string.

A diode connected in parallel with a serial string of solar cells thus prevents overheating in case of damage of one (or several) of the solar cells by limiting power dissipation in the location of the damaged cell(s). However, the undamaged cells are also bypassed, and thus the performance of the photovoltaic module as a whole is reduced. A setup circumventing this problem is described in U.S. Pat. No. 6,020,555 A: In this setup, each solar cell in the serial arrangement is provided with a diode of its own which is connected in parallel with this solar cell; in case of a solar cell failure, the damaged solar cell is bypassed by its diode while the other solar cells remain in operation. The setup disclosed in U.S. Pat. No. 6,020,555 A thus protects solar cells connected in series against failure due to mechanical damage or shadowing of individual solar cells while maintaining full output of the remaining cells.

A scheme for protecting a series parallel arrangement of solar cells against shadowing and cell defects is described in US 2009/0014056 A1. As illustrated in FIG. 15 of US 2009/0014056 A1, a set of reverse current protection diodes and bypass diodes are periodically located in an array of solar cells interconnected by parallel and serial connections. Parallel connections between the solar cells provide current bypasses around single cells in the array that may have low performance due to manufacturing defects or shading, and bypass diodes route current around rows of cells that have a low performance or are shadowed. If excessive current flows through the parallel or series electrical connections, the metals of these connections heat due to ohmic energy dissipation; this may lead to a melting of the metal and permanently open the parallel circuit connection. This kind of open circuit fusing between solar cells connected in parallel can be used to permanently open the circuit around individual solar cells that have a low performance.

While the protective setup described in US 2009/0014056 A1 is capable of permanently short-circuiting defective solar cells within a photovoltaic module, this is accomplished by destroying electrical connections within the module which may be needed otherwise. Thus, there is a need for an overheat protection system which temporarily or permanently eliminates a defective solar cell of a serial and/or parallel array while leaving the remaining solar cell network intact.

SUMMARY OF THE INVENTION

It is an object of the invention to provide a mechanism which protects a photovoltaic module against damage due to overheating of individual solar cells interconnected in serial or in parallel arrangement within this photovoltaic module. The overheat protection system should be capable of shunting out damaged regions of the photovoltaic module at the finest granularity, i.e. at solar cell level.

These objectives are achieved by the features of the independent claim. The other claims and the specification disclose advantageous embodiments of the invention.

According to a first aspect of the invention, a photovoltaic module with a plurality of solar cells and an overheat protection system is provided. The overheat protection system comprises a heat sensor which is thermally coupled to a solar cell and physically integrated into an electrical switch which is electrically connected to said solar cell.

In a preferred embodiment of the invention, the electrical switch comprises a material which undergoes a phase change from a solid to a liquid state when heated above a predetermined threshold temperature. In an alternative embodiment, the electrical switch comprises a material exhibiting a strong change in resistance when heated above a predetermined threshold temperature. In yet another embodiment, the electrical switch comprises a bimetal which flips the switch when heated above a predetermined cutoff threshold temperature.

According to a second aspect of the invention, an overheat protection system for a photovoltaic module with a plurality of solar cells interconnected in a serial arrangement is provided. The overheat protection system comprises an electrical fuse device connected in parallel arrangement with at least one of the solar cells. The resistance of said fuse device rises above a predetermined value when it is heated above a predetermined threshold temperature.

According to a third aspect of the invention, an overheat protection system for a photovoltaic module with a plurality of solar cells interconnected in a parallel arrangement is provided. The overheat protection system comprises an electrical antifuse device connected in serial arrangement with at least one of the solar cells. The resistance of said antifuse device sinks below a predetermined value when it is heated above a predetermined threshold temperature.

BRIEF DESCRIPTION OF THE DRAWINGS

The present invention together with the above-mentioned and other objects and advantages may best be understood from the following detailed description of the embodiments, but not restricted to the embodiments, wherein is shown in.

Figure 1:
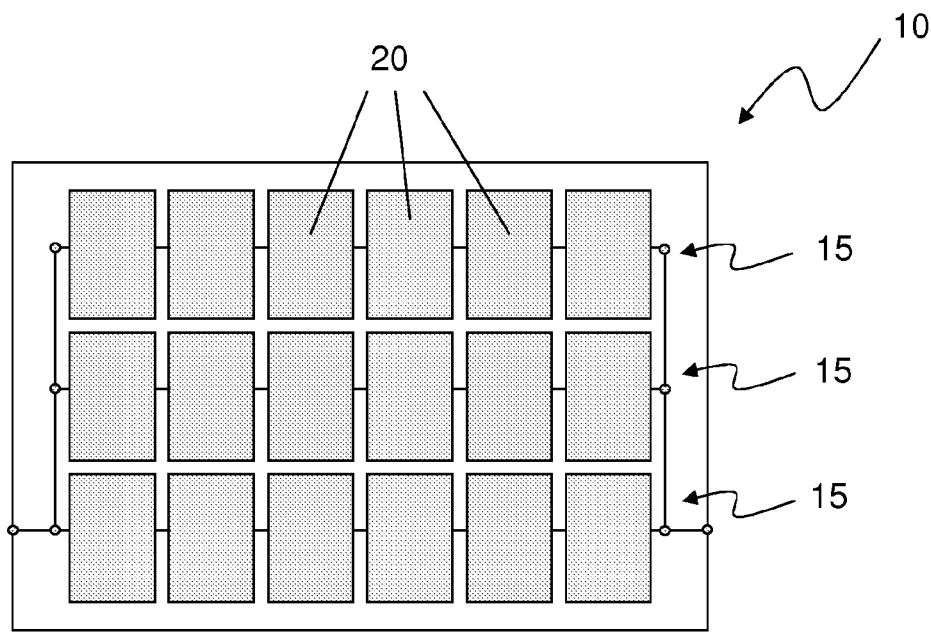
FIG. 1 a schematic view of a photovoltaic module with a plurality of solar cells.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION OF EXAMPLE EMBODIMENTS

FIG. 1 shows a schematic plan view of a photovoltaic module 10 containing a multitude of electrically interconnected solar cells 20. The solar cells 20 may be connected in series to achieve a desired output voltage and/or in parallel to provide a desired amount of current source capability. In the embodiment of FIG. 1, cells 20 are connected in series to form strings 15 which are in turn connected in parallel to form photovoltaic module 10.

Figure 2A:
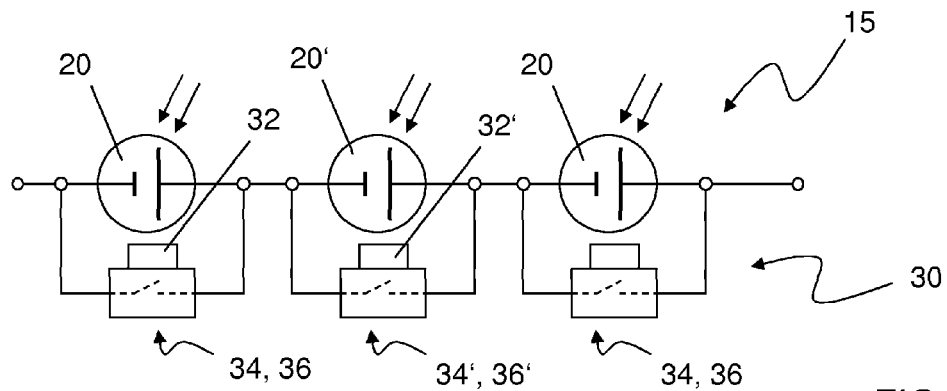
FIG. 2a a schematic view of a serial arrangement of three solar cells with an overheat protection system.

FIG. 2a displays a detailed view of a string 15 of three solar cells 20 connected in a serial arrangement. If a cell 20' in string 15 fails, e.g. due to lifetime degradation and/or a short circuit damage, total current $I_{tot}$ in string 15 is reduced or may even go down to zero. The defective cell 20', rather than contributing to the power output of photovoltaic module 10, will therefore detract from the overall performance of string 15. Moreover, the defective cell 20' absorbs power and therefore heats up and may at the very worst even catch fire. Overheating of solar cells 20 in photovoltaic module 10 is thus an indication of solar cell malfunction and must be avoided in order to protect the photovoltaic module from damage. Conversely, a temperature measurement of solar cells 20 in a photovoltaic module 10 may thus be used to detect malfunction of solar cells 20.

In order to detect overheating and to prevent failure of the photovoltaic module 10, module 10 is equipped with an overheat protection system 30 which comprises heat sensors 32 coupled to electrical switches 34 for short-circuiting solar cells 20 in case of a defect. In the embodiment of FIG. 2a, a heat-sensitive electrical switch 34 is arranged in parallel with each of the solar cells 20 of serial array 15. Switch 34 comprises heat sensor 32 which is thermally coupled to the respective solar cell 20. If heat sensor 32 detects a temperature rise in solar cell 20, this indicates that cooling or IR/UV protection should be applied or that solar cell 20 (and or photovoltaic module 10) may require maintenance. In the extreme, if the temperature of a given solar cell 20' exceeds a certain predefined temperature, this indicates that solar cell 20' is defective and may overheat and thus should be shut down. In this case, heat sensor 32' of cell 20' causes the switch 34' to flip, thus short-circuiting defective solar cell 20'.

In the embodiment of FIG. 2a, switch 34 is embodied as an antifuse device 36, meaning that it blocks current (i.e. acts as an insulator) as long as the temperature of the respective solar cell 20 is low, and it allows current to flow (i.e. has a very low resistance) if the temperature of solar cell 20 rises above the pre-defined cutoff threshold temperature $T_c$. Thus, if a given solar cell 20' within the serial array 15 of solar cells 20 heats up above the cutoff threshold temperature $T_c$, antifuse device 36' pertaining to this solar cell 20' will short-circuit solar cell 20', thus eliminating currents passing through solar cell 20' and avoiding a further heating of this solar cell 20'.

Note that no power output measurement (or any other electrical measurement) on the cell 20 or the module 10 level is required for detecting the presence of a defect/overheating in solar cell 20'. Rather, temperature is used as an indicator for cell malfunction so that a defect in solar cell 20' is directly sensed by heat sensor 32' assigned to solar cell 20'. If a solar cell 20' within photovoltaic module 10 overheats above a predefined cutoff threshold level $T_c$, overheat protection system 30 is activated and short-circuits this cell 20'. Thus, overheat protection system 30 ensures that appropriate damage control measures are taken automatically, immediately and locally, i.e. on cell level. While overheat protection system 30 short-circuits the defective cell(s) 20' from the serial array 15 of module 10, the remaining cells 20 in module 10 continue operation. This ensures electrical functionality of the photovoltaic device 10—albeit at a reduced performance level.

Figure 2B:
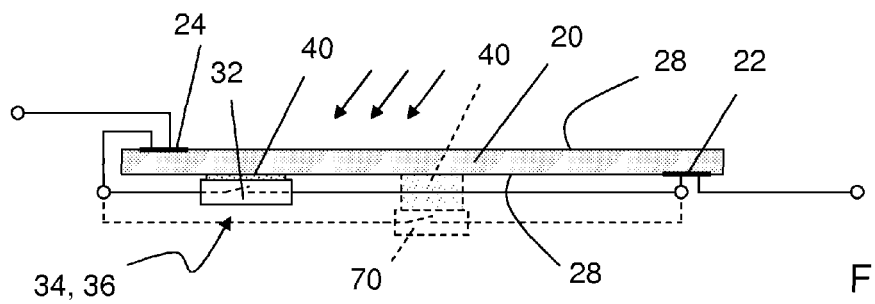
FIG. 2b a sectional view of one of the solar cells of FIG. 2a provided with an antifuse switch.

FIG. 2b shows a detailed view of a preferred embodiment of an overheat protection system 30 in which antifuse switch 36 is integrated into the electrode wiring of solar cell 20 by connecting the contacts of antifuse switch 36 to the DC contacts (bus bars 22, 24 on the back and front surfaces 26, 28) of solar cell 20, e.g. by means of wire bonding. Heat sensor 32 is physically integrated into antifuse switch 36. Antifuse switch 36 is attached to the back surface 26 of solar cell 20 using an adhesive 40 with high thermal conductivity or a thermal paste. In order to ensure good thermal contact between the back surface 26 of solar cell 20 and antifuse switch 36, the casing of antifuse switch 36 has a flat matching the back surface 26 of solar cell 20. These measures ensure a close and direct thermal coupling between the solar cell 20 and heat sensor 32 within antifuse switch 36: Any temperature rise of solar cell 20 is immediately sensed by heat sensor 32 and instantaneously reported to antifuse switch 36. If solar cell 20 reaches cutoff threshold temperature $T_c$, antifuse switch 36 closes so that currents bypass solar cell 20 via antifuse switch 36.

Figure 2C:
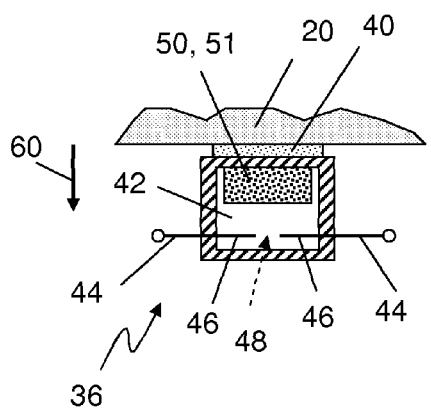
FIG. 2c a detailed sectional view of the antifuse switch of FIG. 2b at a temperature below a transition temperature $T_{trans}$.
Figure 2D:
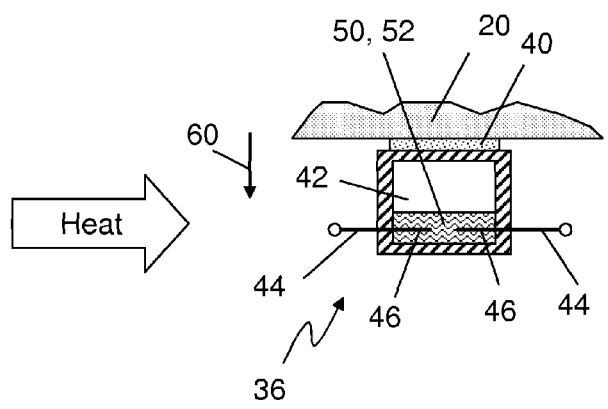
FIG. 2d a detailed sectional view of the antifuse switch of FIG. 2c at a temperature>$T_{trans}$.

FIGS. 2c and 2d show schematic cross-sectional views of a preferred embodiment of a temperature-sensitive antifuse switch 36 which with which solar cell 20 can be short circuited in case of overheating. Antifuse switch 36 is attached to back surface 26 solar cell 20 by means of thermally conducting adhesive 40 in such a way that antifuse switch 36 is located underneath solar cell 20. Antifuse switch 36 comprises a closed cavity 42. End sections 46 of electrical contacts 44 connecting antifuse switch 36 to solar cell 20 protrude into a bottom region of cavity 42 and are separated by a gap 48. Antifuse switch 36 contains a heat sensor 32 which is formed by a slab 51 of an electrically conducting phase change material 50 which exhibits a solid/liquid phase transition at a temperature $T_{trans}$ at or slightly above cutoff threshold temperature $T_c$ of solar cell 20. Slab 51 is suspended in an upper region of cavity 42, well above the end sections 46 of electrical contacts 44 (see FIG. 2c). As long as the temperature of solar cell 20 is low, phase change material 50 is in a solid state, so that electrical contacts 46 are separated from each other and antifuse switch 36 constitutes an insulator. As solar cell 20 heats up above cutoff threshold temperature $T_c$, its heat conducted via adhesive 40 and walls of cavity 42 into slab 51 causes phase change material 50 to melt and liquid material 52, under the effect of gravity (arrow 60), to accumulate in the bottom region of cavity 42 where the electrical contacts 46 are located (see FIG. 2d). Since the phase change material 50 is electrically conducting, liquid 52 short-circuits electrical contacts 46 so that at temperatures above $T_{trans}$, antifuse switch 36 represents a conductor of low ohmic resistance.

Note that in order for the antifuse switch 36 design of FIGS. 2c and 2d to function reliably, gravitational force 60 has to exceed surface tension of liquid phase 52 of material 50. Thus, the location and spacing of electrical contact tips 46 within cavity 42 as well as flow properties of material 50 must be adjusted in such a way that molten material 50 reliably wets contacts 46 in order to short-circuit these contacts 46.

Cutoff threshold temperature $T_c$ of solar cell 20 is chosen in such a way that in the case of a defect, this solar cell 20 is short-circuited well before photovoltaic module 10 will suffer any damage. In particular, $T_c$ is chosen well below the melting point of the solder used for joining the electrical components within photovoltaic module 10. Typically, $T_c$ is at or below 200° C. Suitable compositions to be used as phase change material 50 include Roses metal (with a melting point $T_{trans}$ of about 98° C.), Cerrosafe (with $T_{trans} \approx 74°$ C.), Wood's metal (with $T_{trans} \approx 70°$ C.) and the like.

While FIGS. 2a-2d illustrate a preferred embodiment of a heat protection system 30 to be used for solar cells 20 in a serial arrangement 15, FIGS. 3a-3d show an embodiment of a heat protection system 30' to be used on solar cells 20 linked in a parallel network 16. In a parallel network 16, voltage drop is identical across all parallel branches and is therefore determined by the solar cell 20' with the lowest contribution. A defect of solar cell 20' thus reduces total power output of the whole network 16. Since a defective solar cell 20' is likely to overheat due to increased energy consumption, the temperature rise of cell 20' can again be used as an indicator for detecting the defect in solar cell 20' and for short-circuiting solar cell 20'.

Figure 3A:
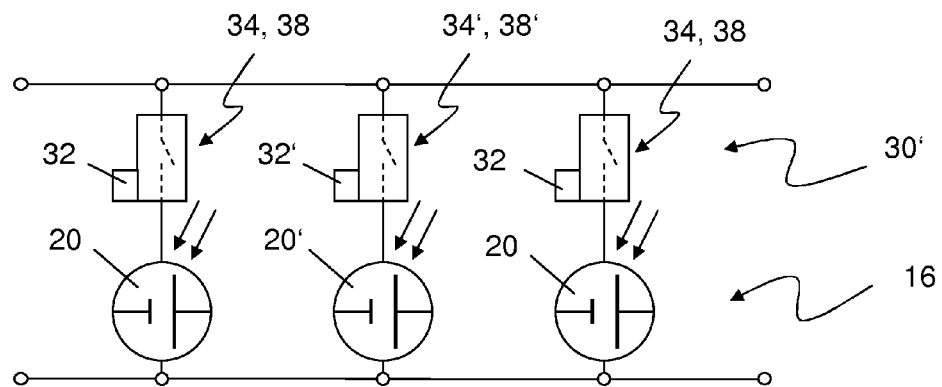
FIG. 3a a schematic view of a parallel arrangement of three solar cells with an overheat protection system.

In order to detect overheating and to prevent low performance in parallel network 16 within photovoltaic module 10, overheat protection system 30' comprising heat sensors 32 coupled to electrical switches 34 is put in place for short-circuiting solar cells 20 in case of a defect. In the embodiment of FIG. 3a, a heat-sensitive electrical switch 34 is arranged in serial arrangement with each of the solar cells 20 of parallel array 16. Analogously to the embodiment of FIG. 2a, electrical switch 34 comprises heat sensor 32 which is thermally coupled to its respective solar cell 20. If a specific heat sensor 32' detects a temperature rise in its respective solar cell 20', it causes the switch 34' to flip to a high resistance state, thus eliminating solar cell 20' from parallel array 16. In the embodiment of FIG. 3a, the switch 34 is thus embodied as a fuse device 38, meaning that it has a very low resistance as long as the temperature of the respective solar cell 20 is low, but blocks current (i.e. acts as an insulator) when the temperature of solar cell 20 rises above the pre-defined cutoff threshold temperature $T_c$. Thus, if a given solar cell 20' within parallel array 16 of solar cells 20 heats up above the cutoff threshold temperature $T_c$, fuse device 38' block currents through solar cell 20', thus avoiding a further heating of this solar cell 20'.

Figure 3B:
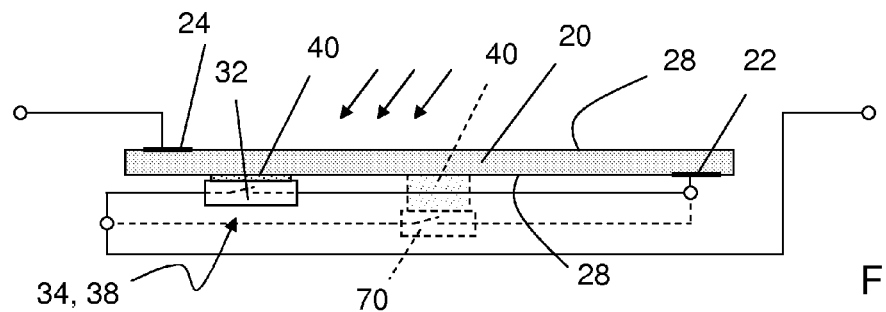
FIG. 3b a sectional view of one of the solar cells of FIG. 3a provided with a fuse switch.

FIG. 3b shows a detailed view of a preferred embodiment of an overheat protection system 30' in which heat sensor 32 is physically integrated into fuse switch 38 and attached to the back surface 26 of solar cell 20 using an adhesive 40 with high thermal conductivity. If solar cell 20 heats up beyond cutoff threshold temperature $T_c$, fuse switch 38 opens so that no currents may pass through solar cell 20.

Figures 3C, 3D:
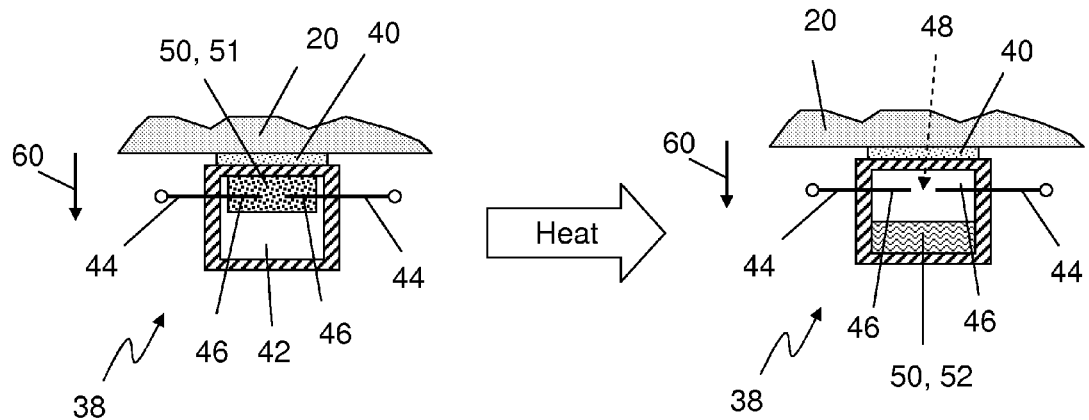
FIG. 3c a detailed sectional view of the fuse switch of FIG. 3b at a temperature below a transition temperature $T_{trans}$.
FIG. 3d a detailed sectional view of the fuse switch of FIG. 3c at a temperature>$T_{trans}$.

FIGS. 3c and 3d show schematic cross-sectional views of a preferred embodiment of temperature-sensitive fuse switch 38 of FIG. 3b. Fuse switch 38 is attached to the back surface 26 of solar cell 20 by means of thermally conducting adhesive 40 in such a way that fuse switch 38 is located underneath solar cell 20. Fuse switch 38 comprises a closed cavity 42; end sections 46 of electrical contacts 44 connecting fuse switch 38 to solar cell 20 protrude into an upper region of cavity 42 and are embedded in a slab 51 of an phase change material 50 with a high electrical conductance which undergoes phase transition from its solid to its liquid state at temperature $T_{trans}$ at or slightly above cutoff threshold temperature $T_c$ (see FIG. 3c). Again, slab 51 acts as a heat sensor 32: as long as solar cell 20 is at a low temperature, slab 51 is in solid state and links electrical contacts 46, so that current flows freely through fuse switch 38 (and through solar cell 20 connected in series with it). If solar cell 20 heats up above cutoff threshold temperature $T_c$, it heats up slab 51 and causes it to melt; the liquid material 52, under the effect of gravity (arrow 60), flows off the contacts 46 and accumulates in the bottom region of cavity 42. As a consequence, contacts 46 are electrically separated from each other by a gap 48, so that at temperatures above $T_{trans}$, fuse switch 38 acts as an insulator and prevents currents to flow through solar cell 20 connected in series with it.

Note that, aside from defects, shading of solar cells 20 may also cause problems in terms of increased temperature, even though this temperatures raise is generally not as high as the temperature rise in physically defective cells. However, a permanent raise in temperature due to shading may cause long term damage of solar cells 20 due to high thermal stress. Therefore, in case of shading, it is advisable to temporarily turn off affected cells 20 to prevent thermal stress; this can be accomplished by using a bimetallic switch 70 thermally coupled to solar cell 20 and arranged in parallel with antifuse switch 36 (see FIG. 2b) of fuse switch (see FIG. 3b). If temperature of solar cell 20 rises above a predefined intermediate threshold temperature $T_i$ (where $T_i < T_c$), bimetallic switch 70 reversibly short-circuits cell 20 (or, in the case of a parallel arrangement of FIG. 3b, blocks currents through cell 20); as soon as shading is over, bimetallic switch 70 returns cell 20 back into the serial/parallel array 15/16.

Figure 4:
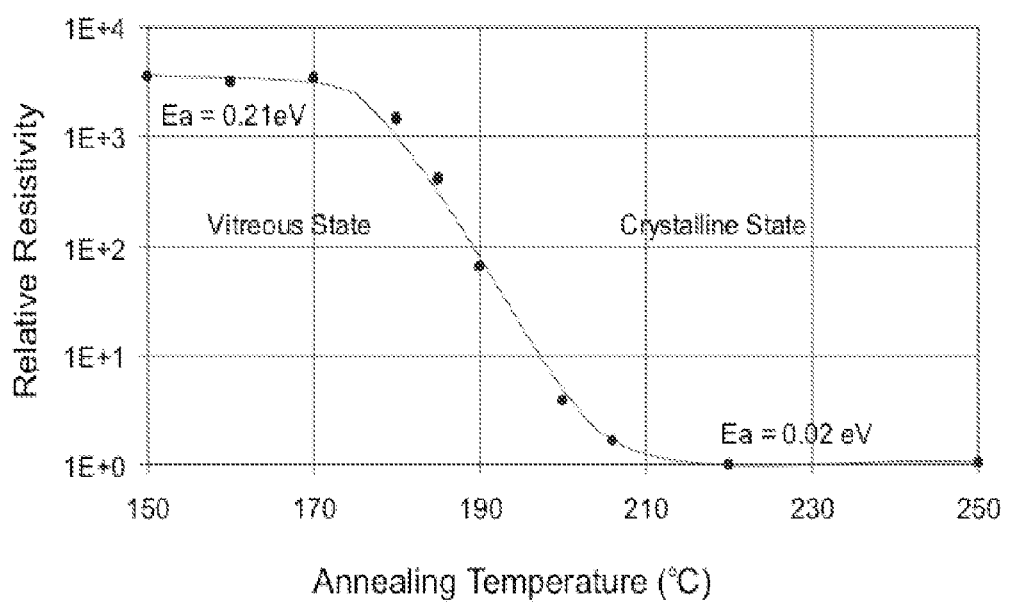
FIG. 4 a diagram of resistivity of $Ge_2Sb_2Te_5$ as a function of temperature.

While the embodiments of FIGS. 2c, 2d and 3c, 3d show electrical switches 34 making use of a solid/liquid transition in a phase change material 50 for activating switch 36, 38, alternatively a phase change material 50' exhibiting a dramatic change in resistance at a transition temperature $T'_{trans}$ at or below 200° C. may be used. As an example, chalcogenide alloys (such as the GeSbTe alloy system) exhibit a temperature induced phase transition between a high resistivity amorphous and a low resistivity microcrystalline phase. FIG. 4 shows a plot of relative resistivity of $Ge_2Sb_2Te_5$ as a function of temperature. For use in an antifuse switch 36, resistivity has to be high at low temperatures and has to decrease when antifuse switch 36' is heated above predetermined threshold temperature T. For use in a fuse switch 38', resistivity has to be low at low temperatures and has to increase when fuse switch 38' is heated above predetermined threshold temperature $T_c$.

As a further option, temperature dependence of resistivity within metals may be used to detect a rise in temperature in a solar cell 20 or a photovoltaic module 10.

The design of an overheat protection system 30 with thermally activated fuse/antifuse switches 36, 38 for permanently shutting off or bypassing individual solar cells 20 in serial and/or parallel arrangement within photovoltaic modules 10 provides an effective way of protecting modules 10 against (local) overheating and damage. Moreover, by including a lower-temperature reversible (bimetallic) switch 70, overheat protection system 30 prevents thermal damage both on a high temperature and a low temperature level. Bimetallic switch 70 avoids long term damages due to moderate heating of solar cells 20 whereas permanent switch 34 avoids overheating of solar cell 20 which may cause the respective cell 20 and/or photovoltaic module 10 to catch fire.

The invention claimed is:

1. A photovoltaic module (10) with a plurality of solar cells (20) and an overheat protection system (30, 30'), characterized in that
    the overheat protection system (30, 30') comprises a heat sensor (32) thermally coupled to a solar cell (20),
    said heat sensor (32) being physically integrated into an electrical switch (34) which is electrically connected to said solar cell (20), wherein the electrical switch (34) comprises a cavity (42) containing a phase change material (50) which undergoes a phase change from a solid to a liquid state if it is heated above a predetermined cutoff threshold temperature ($T_c$).

2. The photovoltaic module (10) according to claim 1, characterized in that the phase change material (50) is electrically conducting, and that electrical contacts (46) of the switch (38) protruding into the switch cavity (42)
    are electrical connected when the phase change material (50) is in its solid state and
    are electrically disconnected when the phase change material (50) is in its liquid state.

3. The photovoltaic module (10) according to claim 1, characterized in that the phase change material (50) is electrically conducting, and that electrical contacts (46) of the switch (36) protruding into the switch cavity (42)
    are electrical disconnected when the phase change material (50) in its solid state and
    are electrically connected when the phase change material (50) is in its liquid state.

4. The photovoltaic module (10) according to claim 1, characterized in that the electrical switch (34, 36, 38) is actuated by gravity acting on the phase change material (50) which, in its solid state, it is located in an upper region within the cavity (42), and, when heated above the threshold temperature, melts to occupy a bottom region of the cavity (42).

5. The photovoltaic module (10) according to claim 1, characterized in that the heat sensor (32) is incorporated into an electrical fuse device (38) in such a way that the electrical resistance of said fuse device (38) rises above a predetermined value if the temperature recorded by said heat sensor (32) exceeds a predetermined cutoff threshold temperature ($T_c$).

6. The photovoltaic module (10) according to claim 5, characterized in that
    the solar cells (20) are interconnected in a parallel arrangement (16),
    and each solar cell (20) is connected in serial arrangement to an electrical fuse device (38) comprising a heat sensor (32), said heat sensor (32) being thermally coupled to said solar cell (20).

7. The photovoltaic module (10) according to claim 5, characterized in that the electrical fuse device (38) blocks currents through solar cell (20) permanently once the temperature of said solar cell (20) exceeds a predetermined cutoff threshold temperature ($T_c$).

8. The photovoltaic module (10) according to claim 1, characterized in that the heat sensor (32) is incorporated into an electrical antifuse device (36) in such a way that the electrical resistance of said fuse device (36) sinks below a predetermined value if the temperature recorded by said heat sensor (32) exceeds a predetermined threshold temperature ($T_c$).

9. The photovoltaic module (10) according to claim 8, characterized in that
    the solar cells (20) are interconnected in a serial arrangement (15),
    and each solar cell (20) is connected in parallel arrangement to an electrical antifuse device (36) comprising a heat sensor (32), said heat sensor (32) being thermally coupled to said solar cell (20).

10. The photovoltaic module (10) according to claim 8, characterized in that the electrical antifuse device (36) short-circuits solar cell (20) permanently once the temperature of said solar cell (20) exceeds a predetermined cutoff threshold temperature ($T_c$).

11. An overheat protection system (30') for a photovoltaic module (10) with a plurality of solar cells (20) interconnected in a parallel arrangement (16), said overheat protection system (30') comprising an electrical fuse device (38) connected in serial arrangement with at least one of the solar cells (20), characterized in that said fuse device (38) comprises a heat sensor (32) which causes the resistance of said fuse device (38) to rise above a predetermined value if the temperature recorded by said heat sensor (32) exceeds a predetermined threshold temperature ($T_c$).

12. An overheat protection system (30) for a photovoltaic module (10) with a plurality of solar cells (20) interconnected in a serial arrangement (15), said overheat protection system (30) comprising an electrical antifuse device (36) connected in parallel arrangement with at least one of the solar cells (20), characterized in that said antifuse device (36) comprises a heat sensor (32) which causes the resistance of said antifuse device (36) to sink below a predetermined value if the temperature recorded by said heat sensor (32) exceeds a predetermined threshold temperature ($T_c$).

* * * * *